United States Patent [19]

Wilson et al.

[11] Patent Number: 5,619,202

[45] Date of Patent: Apr. 8, 1997

[54] VARIABLE SAMPLE RATE ADC

[75] Inventors: James Wilson, Sharon; Ronald A. Cellini, Newton; James M. Sobol, Norfolk, all of Mass.

[73] Assignee: Analog Devices, Inc., Norwood, Mass.

[21] Appl. No.: 343,713

[22] Filed: Nov. 22, 1994

[51] Int. Cl.⁶ .................................................. H03M 1/00
[52] U.S. Cl. ......................................... 341/143; 341/123
[58] Field of Search ................................... 341/123, 143, 341/155

[56] References Cited

U.S. PATENT DOCUMENTS

| | | | |
|---|---|---|---|
| 3,949,175 | 4/1976 | Tanizoe et al. | 179/15.55 T |
| 4,179,670 | 12/1979 | Kingsbury | 331/10 |
| 4,281,318 | 7/1981 | Candy et al. | 341/61 |
| 4,797,845 | 1/1989 | Stikvoort | 364/724.1 |
| 4,833,474 | 5/1989 | Nagai et al. | 341/166 |
| 4,953,117 | 8/1990 | Lagadec | 364/724.1 |
| 4,954,824 | 9/1990 | Yamada et al. | 341/61 |
| 4,987,373 | 1/1991 | Soo | 328/155 |
| 4,990,911 | 2/1991 | Fujita et al. | 341/123 |
| 5,075,679 | 12/1991 | Gazsi | 341/61 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,157,395 | 10/1992 | Del Signore et al. | 341/143 |
| 5,204,827 | 4/1993 | Fujita et al. | 364/724.1 |
| 5,225,787 | 7/1993 | Therssen | 328/15 |
| 5,227,787 | 7/1993 | Kurashina | 341/61 |
| 5,313,205 | 5/1994 | Wilson | 341/144 |
| 5,353,026 | 10/1994 | Wilson | 341/143 |

OTHER PUBLICATIONS

D. Hossack et al. "A Method for the Evaluation of Multirate Sigma–Delta Systems", Dept. Of Electronics and Electrical Engineering, Univ. of Glasgow, Glasgow G12 800, United Kingdom, 1992 IEEE International Symposium on Circuits & Systems, vol. 3 of 6, May 1992, pp. 1328–1331.

Hossack et al., "A Method for the Evaluation of Multirate Sigma–Delta Systems", 1992 IEEE International Symposium on Circuits and Systems, Vo. 3 of 6, pp. 1328–1331.
J. Janssen, et al. An Audio Engineering Society Preprint Feb. 26–Mar. 1, 1994.
Richard J. Higgins, Digital Signal Processing in VLSI, Prentice Hall, Englewood Cliffs, NJ 07632.
Douglas F. Elliott, et al, Fast Transforms, Algorithms, Analyses, Applications, 1982, Academic Press.
Paul J. Hurst, et al. A Programmable Clock Generator Using Noise Shaping and Its Application in a Switched–Capacitor Filter, Solid State Circuits Research Laboratory, Dept. of Electrical and Computer Engineering, University of California, Davis.

*Primary Examiner*—Jeffrey A. Gaffin
*Assistant Examiner*—Peguy JeanPierre
*Attorney, Agent, or Firm*—Wolf, Greenfield & Sacks, P.C.

[57] ABSTRACT

A method and apparatus for analog-to-digital conversion using sigma-delta modulation of the temporal spacing between digital samples are provided. The method and apparatus include sigma-delta modulation of the time-base such that errors produced by non-uniform sampling are frequency-shaped to a high frequency region where they are reduced by conventional digital filtering techniques. In one embodiment, a sigma-delta ADC receives an analog input signal and converts the analog input signal to digital samples at an oversampling rate. A decimator, coupled to the sigma-delta ADC, receives the digital samples and decimates the digital samples to produce the digital samples at a preselected output sample rate, less than the oversampling rate. An ADC sample rate control circuit, coupled to the ADC, receives a frequency select signal representing the preselected output sample rate, and produces a noise-shaped clock signal for controlling operation of the ADC at the oversampling rate. The control circuit includes a sigma-delta modulator for sigma-delta modulating the frequency select signal. A randomizer/suppressor circuit, under control of the output of the sigma-delta modulator, receives an input clock signal and adjusts the frequency of the clock signal to produce a noise-shaped clock signal for controlling the oversampling rate of the ADC.

8 Claims, 5 Drawing Sheets

VARIABLE SAMPLE RATE ADC

RELATED APPLICATIONS

The present application is related to the following U.S. applications: "Analog to Digital Conversion Having Variable Sample Rate", filed Sep. 13, 1993, Ser. No. 08/121,104; "Digital to Analog Conversion Having Variable Sample Rate", filed Sep. 13, 1993, Ser. No. 08/120,957; "Digital to Digital Sample Rate Conversion", filed May 11, 1994, Ser. No. 08/241,059; and the following International applications: "Analog to Digital Conversion Using Non-uniform Sample Rates", filed Sep. 13, 1994, Ser. No. US94/10268; and "Digital to Analog Conversion Using Non-uniform Sample Rates", filed Sep. 13, 1994, Ser. No. US94/10269. Each of the above applications is incorporated herein by reference in its entirety.

1. Field of the Invention

The present invention relates generally to the field of methods and circuits for analog-to-digital conversion. More particularly, the present invention relates to a method and circuit for analog-to-digital signal conversion using sigma-delta modulation of the temporal spacing between digital samples.

2. Background of the Invention

Sigma-delta analog-to-digital converters ("ADCs") and digital-to-analog converters ("DACs") have recently come into widespread use with the development of suitable process technology and the increase in digital audio and other applications. Sigma-delta converters utilize oversampling techniques (i.e., sampling at rates greater than the Nyquist rate) to achieve high signal-to-noise ratios. Such converters also exhibit excellent linearity. Additionally, sigma-delta converters are relatively straight-forward and inexpensive to implement due to their simplicity.

A sigma-delta ADC converts an analog input voltage to digital output samples at a predetermined rate. A typical sigma-delta ADC includes a front-end modulator which, by performing an oversampling technique referred to as "noise shaping", manipulates the noise spectrum such that a major component of the quantization noise power is shifted to a frequency range higher than the upper frequency limit of the band of interest, which is typically the signal bandwidth (within the output samples). Subsequent filtering and decimation is performed in the digital domain to reduce the high frequency quantization noise component of the digital output samples. Sigma-delta converters are described in *Mixed-Signal Design Seminar*, published by Analog Devices, Inc., Norwood, Mass., 1991, which reference is incorporated herein by reference.

A conventional one-bit sigma-delta ADC system is shown in FIG. 1. It includes an analog low-pass filter 12. The analog low-pass filter typically has a stop-band frequency equal to $kf_s/2$ where $f_s$ is the sample rate at which the ADC 16 operates ("k" is discussed below.). Low-pass filter 12 receives an analog input signal on line 10 and implements a portion of a required anti-aliasing function for the ADC system. The filtered analog input signal is then provided to the sigma-delta ADC 16 along line 14. The sigma-delta ADC 16 converts the analog signal on line 14 to a one-bit digital data stream and also performs noise-shaping on the analog input signal. In sigma-delta ADCs, the sigma-delta modulators are typically implemented with analog circuitry. The sigma-delta ADC modulator effectively low-pass filters the signal of interest and high-pass filters the quantization noise of the signal. The output of the sigma-delta ADC is typically a high frequency one-bit data stream, which is provided on line 20 to filter 22.

The sigma-delta ADC is typically clocked at a frequency $kf_s$, or k times the sample rate, where k is the oversampling ratio of the modulator. The clock signal $kf_s$ is received by the sigma-delta ADC 16 on line 18. Digital low-pass filter 22 also performs the anti-aliasing function on the digital data stream output of sigma-delta ADC 16 and has sufficient stop-band attenuation at $f_s/2$ to achieve the desired dynamic range. The digital low-pass filter 22 reduces the shaped quantization noise that resides in the upper frequency band. The output samples of the filter 22 are provided on line 24 to decimator 26 which provides a data rate reduction of the samples to sample rate $f_s$. Decimation can be viewed as the method by which redundant information contained in the digital samples introduced by the oversampling process is removed. Examples of decimators are described in *Introduction to Digital Signal Processing* by John Proakis and Dimitris Manolakis, published by Macmillan Publishing Company, 1988, which is herein incorporated by reference. While the filter 22 and decimator 26 are shown as two separate elements, those skilled in the art will understand that, in practice, the filter and decimator can be implemented in a single filter component such as an FIR digital filter.

A limitation of conventional ADCs, including the typical sigma-delta ADC shown in FIG. 1, is that they determine the magnitude of the analog input signal only at equally spaced temporal intervals. Such a process is known as uniform sampling. Additionally, with conventional ADCs, the sample rate $f_s$ at which the ADC operates is not made independent of the master clock signal used for clocking the ADC. The sample rate $f_s$ must be some integer division of the master clock signal. Consequently, if an application requires two different digital output data rates, at least one of which is not divisible into the master clock signal, for example, then two master clock signals (having different frequencies) are required for clocking the ADC.

Accordingly, a general object of the present invention is to provide a method and apparatus for performing analog-to-digital conversion using non-uniform sampling (i.e., variable temporal spacing of the sampling points, independent of the master clock signal).

SUMMARY OF THE INVENTION

The present invention provides a method and apparatus for analog-to-digital conversion using non-uniform sampling. In an embodiment of the invention, the apparatus includes an ADC system including an ADC that receives an analog input signal and converts the analog input signal to digital samples at an oversampling rate. A decimator, coupled to the ADC, receives the digital samples and decimates the digital samples to produce the digital samples at a preselected output sample rate, less than the oversampling rate. An ADC sample rate control circuit, also coupled to the ADC, receives a frequency select signal representing the preselected output sample rate, and produces a noise-shaped clock signal for controlling operation of the ADC at the oversampling rate. The control circuit includes a sigma-delta modulator for sigma-delta modulating the frequency select signal.

In a preferred embodiment of the present invention, the ADC includes a sigma-delta ADC.

Also in a preferred embodiment of the present invention, the control circuit includes a frequency select circuit, coupled to the sigma-delta modulator, that receives the preselected output sample rate as an input signal, and produces the frequency select signal for provision to the sigma-delta modulator.

In one embodiment, the frequency select circuit includes a memory element storing a plurality of frequency select signals and corresponding output sample rates, and a decoder, coupled to the memory element, that receives the preselected output sample rate and selects a corresponding frequency select signal for provision to the sigma-delta modulator.

Preferably, the control circuit also includes a randomizer/suppressor circuit, coupled between the sigma-delta modulator and the ADC, which receives an input clock signal and adjusts the frequency of the clock signal based on the output of the sigma-delta modulator to produce a noise-shaped clock for controlling the oversampling rate of the ADC. The control circuit also preferably includes a frequency divider, coupled between the randomizer/suppressor circuit and the ADC, that further adjusts the frequency of the noise-shaped clock.

Preferably, the input clock signal includes a master clock signal.

Another aspect of the present invention includes a method for producing, from an analog input signal, digital samples at a predetermined sample rate. The method includes the steps of computing the frequency select signal corresponding to the predetermined sample rate; producing, from the frequency select signal, a noise-shaped clock signal; converting the analog input signal to digital samples at an oversampled rate controlled by the noise-shaped clock signal; and decimating the digital samples to reduce the rate of the digital samples to the predetermined sample rate.

In a preferred embodiment of an aspect of the present invention, the step of producing includes the step of sigma-delta modulating the frequency select signal. The step of producing also includes the step of adjusting the frequency of an input clock signal based on the sigma-delta modulated frequency select signal.

The features and advantages of the present invention will be more readily understood and apparent from the following detailed description of the invention, which should be read in conjunction with the accompanying drawings, and from the claims which are appended to the end of the detailed description.

DETAILED DESCRIPTION

For purposes of illustration only, and not to limit the scope of the present invention, the invention will be explained with reference to specific sample rates, oversampling ratios and clock frequencies of operation. One skilled in the art will recognize that the present invention is not limited to the specific examples disclosed and can be more generally applied to other circuits and methods having different operating parameters than those disclosed.

Figure 1:
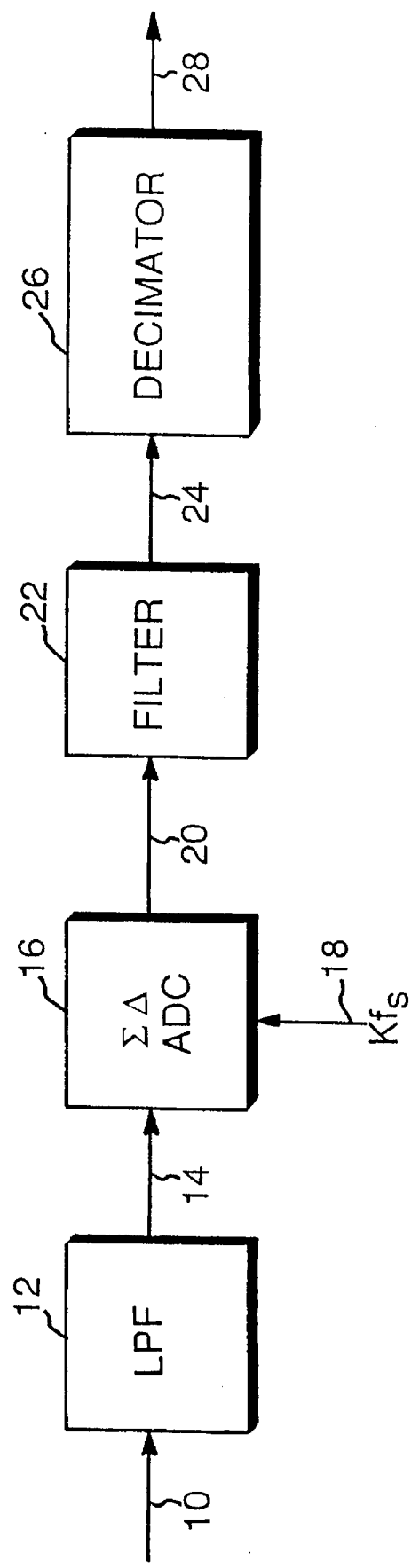
FIG. 1 is a block diagram of a conventional sigma-delta ADC system.
Figure 2:
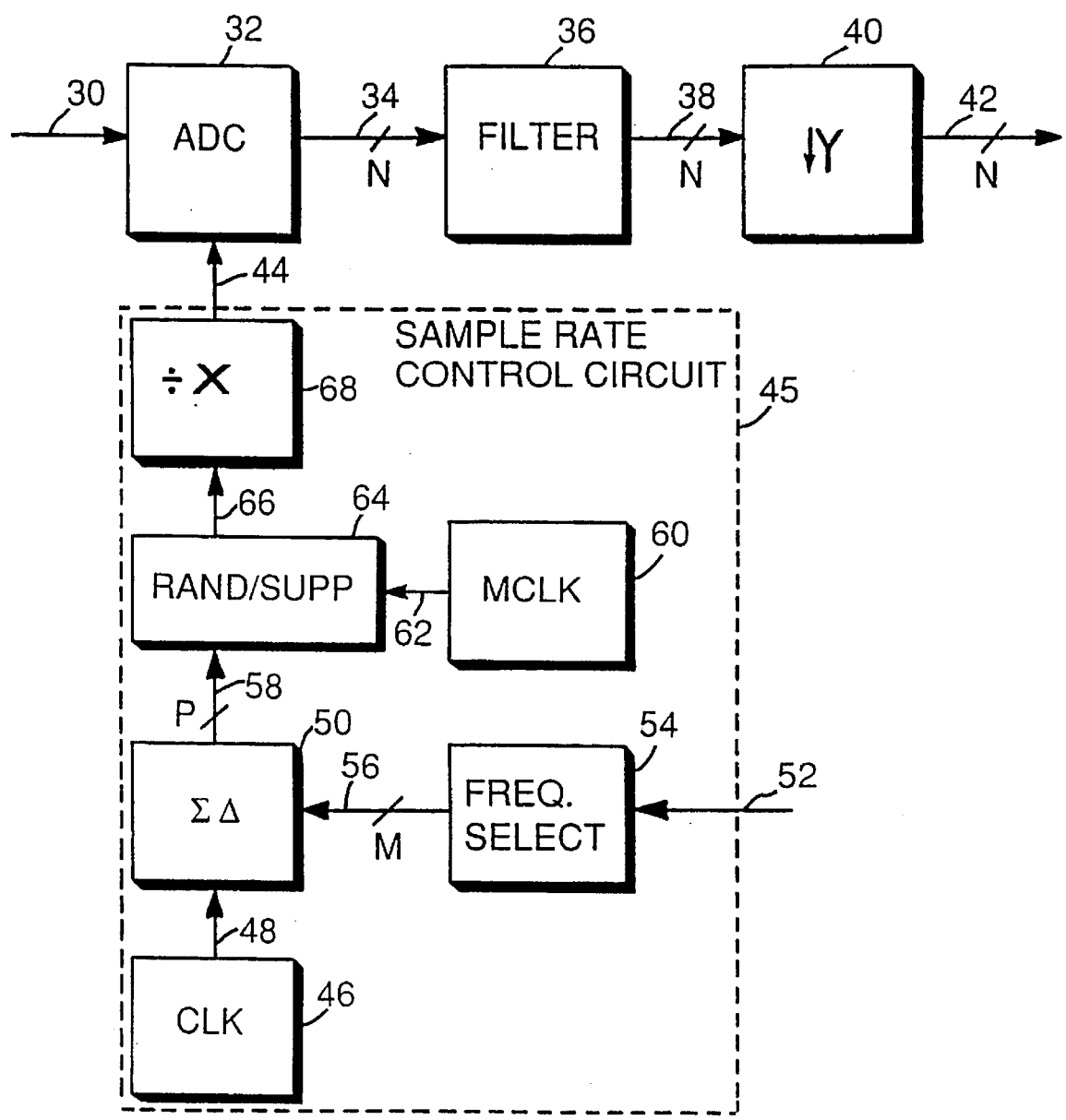
FIG. 2 is a block diagram of a general ADC system according to the present invention.

FIG. 2 is a block diagram broadly illustrating one embodiment of the present invention. The invention includes an ADC system including an ADC 32 receiving an analog input signal on line 30. ADC 32 converts the analog input signal to an N-bit digital data stream on bus 34 at a sample rate controlled by a clock signal received on line 44. ADC 32 operates at a rate such that it oversamples the analog input signal received on line 30. It is to be appreciated that ADC 32 may be an oversampling type converter itself such as a sigma-delta ADC. Alternatively, a conventional ADC could be operated at a sufficiently fast rate to oversample the analog input signal. A low-pass filter 36 then filters the digital data stream received on bus 34 and provides a filtered digital data stream on bus 38 to decimator 40. As will be appreciated by those skilled in the art, digital filter 36 reduces images of the signal as a result of the oversampling process. Decimator 40 then decimates the filtered data stream by constant factor Y to produce digital output samples on bus 42 at a predetermined output sample rate. Filter 36 and decimator 40 can be implemented in a single digital filter element, such as an FIR or IIR filter.

The overall purpose of the circuit is to produce digital output samples on bus 42 at a preselected output sample rate, which may be any rate within a certain range. The preselected output sample rate is input on line 52 to the sample rate control circuit 45 which, in response, computes a clock signal and provides that clock signal on line 44 to control the sample rate of ADC 32. Because the sample rate of the ADC is proportional to the oversampling ratio of the system, the sample rate control circuit 45 controls the oversampling ratio, as will be described in greater detail below. The fixed decimation ratio Y of decimator 40 is preferably equal to the oversampling ratio for producing output samples on bus 42 at the preselected output sample rate. The preselected output sample rate can be any frequency value within a certain range, and can be independent of the frequency of a master clock signal of the system.

From a user-inputted desired output sample rate received on line 52, sample rate control circuit 45 produces a clock signal on line 44 which has a sigma-delta noise-shaped characteristic. Frequency select circuit 54 produces, from the desired output sample rate input signal, an M-bit digital frequency select signal representing the desired output sample rate. Digital sigma-delta modulator 50 receives the frequency select signal on bus 56 and sigma-delta modulates the frequency select signal to produce a P-bit output code on bus 58. Sigma-delta modulator 50 operates at a constant rate controlled by clock 46. A clock signal produced by clock 46 is provided to sigma-delta modulator 50 on line 48.

Randomizer/suppressor circuit 64 receives a master clock signal as an input on line 62 from master clock circuit 60 and, by control of the P-bit output code of sigma-delta modulator 50, allows a certain number of master clock signals within a set number of such signals to be outputted on line 66. In other words, a clock signal equal to a fraction (from 0 to 1) of the master clock signal will be outputted by the randomizer/suppressor circuit, the fraction depending on the P-bit code outputted by the sigma-delta modulator. The randomizer/suppressor circuit can be any one of such circuits well-known in the art. One example of such a circuit is described in *Phase Lock Loops, Theory, Design, and Applications* by Roland E. Best, published by McGraw-Hill Book Company, 1984. The clock signal outputted on line 66 has a sigma-delta noise-shaped characteristic due to the control of the sigma-delta output code on bus 58.

The noise-shaped clock signal on line 66 can then be frequency-adjusted by frequency divider 68 and provided on line 44 to control the rate of operation of ADC 32. Frequency divider 68 reduces the frequency of the noise-shaped output signal received on line 66 by a constant factor of X. Divider 68 may be implemented with a counter, as will be understood by those skilled in the art. This factor X is selected to achieve a desired oversampling ratio of the ADC system. The frequency of the clock signal on line 66 is related the preselected sample rate inputted on line 52 and the master clock signal produced by master clock 60, which is known. Thus, the ratio of the clock signal produced on line 66 to the preselected output sample rate is known and thereby factor X of divider 68 can be preselected to achieve a desired oversampling ratio to suit a particular application.

An example of the operation of the ADC system follows. Assume that the clock signal produced on line 48 by clock 46 is 3.072 MHz. Therefore, sigma-delta modulator 50 operates at 3.072 MHz. Additionally, assume that the master clock signal received on line 62 from master clock 60 is 24.576 MHz. If the desired output sample rate of the digital output samples produced on bus 42 is 48 kHz, then a user would enter 48 kHz on line 52. Frequency select circuit 54 would produce, based on the 48 kHz input signal, an M-bit frequency select signal on line 56 representing the desired output data rate of 48 kHz. It should be understood that the number of bits M in the frequency select signal controls the precision with which the ADC system can achieve the desired output sample rate.

The frequency select signal is sigma-delta modulated by sigma-delta modulator 50 at the rate of 3.072 MHz and a P-bit output code is provided on bus 58. The P-bit output code of sigma-delta modulator 50 has a sigma-delta noise-shaped characteristic and controls randomizer/suppressor circuit 64 to adjust the frequency of the 24.576 MHz master clock signal received on line 62. Specifically, the output code of the sigma-delta modulator 50 controls the randomizer/suppressor circuit 54 to pass a fraction of the master clock signal. In this particular example, with a desired output sample rate of 48 kHz, preferably 6 out of 8 master clock signals are outputted to line 66. In other words, ¾ of the 24.576 MHz master clock signal, or an 18.432 MHz clock signal, is provided on line 66. This 18.432 MHz clock signal has a noise-shaped frequency characteristic and is approximately equal (depending on the resolution of the system) to 384 times the desired output sample rate of 48 kHz. The 18.432 MHz clock signal can then be frequency adjusted by divider 68 to adjust the oversampling ratio of the ADC. If an oversampling ratio of 384 is desired, then further division by divider 68 is not necessary and a factor X of 1 is used. If, alternatively, an oversampling ratio of 64 is desired, then the factor X is set to 6 and the 18.432 clock signal is divided by a factor of 6 by divider 68 and the resulting 3.072 MHz clock signal is provided on line 44 to control the rate of operation of the ADC. It is noted that the 3.072 MHz signal is 64 times the desired output rate of 48 kHz (i.e., an oversampling ratio of 64). Thus, in this example, the decimation factor Y of decimator 40 would be set to 64 to produce output samples on bus 42 at the desired output sample rate of 48 kHz.

As will be appreciated by those skilled in the art, the oversampling ratio of the ADC system, set in part by factor X of divider 68, is proportional to the signal-to-noise ratio of the ADC system. A higher oversampling ratio produces a higher signal-to-noise ratio and a more accurate output. A higher oversampling ratio, however, requires a larger decimation factor which necessitates longer filters that are more difficult and expensive to accurately implement. Consequently, as will be understood by those skilled in the art, a balance must be struck between the desire for a higher oversampling ratio and the practical limitations on large digital filters.

Sigma-delta modulator 50 preferably is an n-th order, P-bit modulator. A higher order sigma-delta modulator will typically produce output samples with greater noise-shaped characteristics (i.e., a higher signal-to-noise ratio). The sigma-delta modulator is chosen to produce a P-bit output code (where $P \geq 1$ in a preferred embodiment) because, as the number of bits in the output code is increased, the clock rate necessary to operate the sigma-delta modulator 50 is reduced. It is to be appreciated, however, that the invention is not so limited. Sigma-delta modulator 50 could alternatively be a 1-bit modulator if the clock frequency received on line 48 and used to clock the modulator is appropriately increased.

A key feature of the present invention is that the temporal spacing of the sampling points is controlled by the n-th order, P-bit sigma-delta modulator such that any errors (i.e., noise on the sampling points) produced by the non-uniform sampling are shaped ("noise-shaped") to a high frequency range. As is well-known in the field of sigma-delta systems, the shaped noise errors can be reduced by conventional digital filtering techniques.

Several other advantages are also obtained. By appropriate choice of the rate at which the sigma-delta spaced sampling points are generated, and the number of bits used in controlling the spacing of those sampling points, the signal-to-noise ratio of the output data samples on bus 42 can be controlled. Additionally, the degree of filtering used on the digital data stream on bus 34 can also be varied to adjust the signal-to-noise ratio to suit a particular application.

Figure 3:
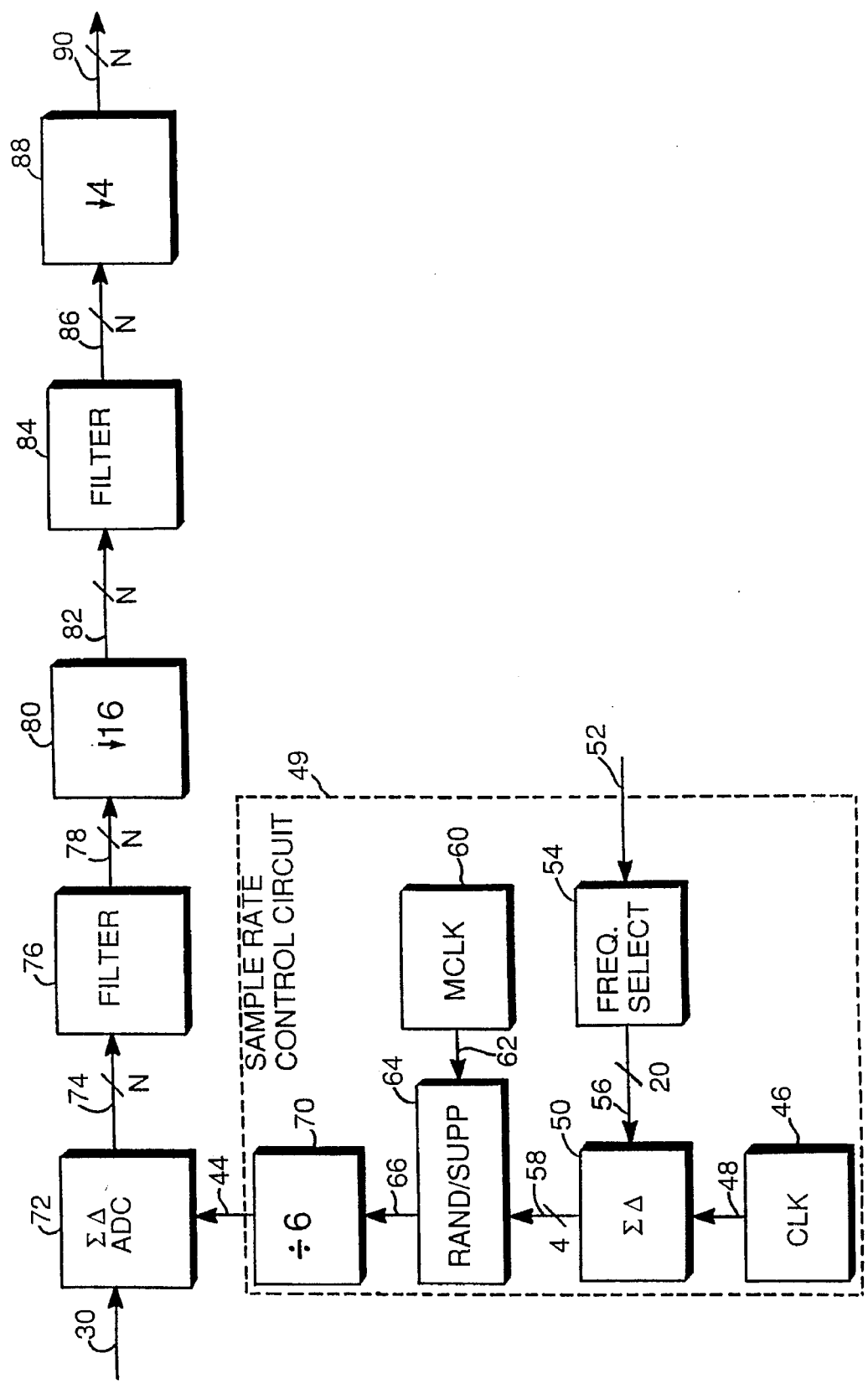
FIG. 3 is a more detailed block diagram of a sigma-delta ADC system according to a preferred embodiment of the present invention.

FIG. 3 shows, in block diagram form, the preferred embodiment of the ADC system of the present invention. In the ADC system of FIG. 3, ADC 72 is preferably a sigma-delta ADC which receives an analog input signal on line 30 and provides an oversampled N-bit digital data stream on bus 74 at an oversampling rate controlled by the noise-shaped clock signal received on line 44. The digital data stream on bus 74 is filtered by low-pass filter 76 to remove out of band noise and quantization noise that result from the oversampling and conversion process. The N-bit filtered data stream is provided on bus 78 to decimator 80 that decimates the data stream on bus 78 by a fixed decimation ratio (16 in the illustrated embodiment). The decimated digital data stream is provided on bus 82 to filter 84 which low-pass filters the data stream to remove additional images and quantization noise that result from the non-uniform sampling. The filtered digital data stream is provided on bus 86 to decimator 88 which further decimates the data stream by another fixed decimation ratio (4 in the illustrated embodiment) to provide output data samples on bus 90 at the preselected output sample rate. The filters can be implemented as any type of digital FIR or IIR filter. For example, the filters could be sinc-type FIR filters.

The digital data streams on buses 74, 78, 82 and 86 are indicated as being N-bits wide in FIG. 3. N can be any number of bits and is typically chosen to produce the widest bit stream commensurate with the accuracy requirements of the particular application. Alternatively, the digital data streams may have different widths on the different buses.

In this preferred embodiment, the n-th order, P-bit sigma-delta modulator 68 is a fourth order, four-bit modulator. Modulator 68 provides a four-bit code on bus 58 that controls the randomizer/suppressor circuit 64. Sigma-delta modulator 68 preferably is clocked using a 3.072 MHz clock 46. The master clock signal on line 62 preferably is 24.576 MHz. The frequency select signal produced by frequency select circuit 54 on line 56 preferably is a 20-bit number. The frequency select number ranges from $-2^{19}$ to $+2^{19}$. This 20-bit number controls the precision with which the four-bit number output by the sigma-delta modulator 68 represents the desired output sample rate. Sigma-delta modulator 68 modulates the 20-bit frequency select number to produce sigma-delta modulated four-bit codes on bus 58 that control the randomizer/suppressor circuit 64. The first bit of the four-bit code is a sign bit. The remaining three bits control the randomizer/suppressor circuit, as described above.

Table 1 (below) illustrates the relationship among the four-bit output codes produced by the sigma-delta modulator 68, the fraction of master clock signals passed by the randomizer/suppressor circuit 64, and the desired output sample rates when modulator 58 is clocked with a 3.072 MHz clock and the master clock input signal to the randomizer/suppressor circuit 64 is 24.576 MHz.

TABLE 1

| 4 BIT CODE | NUMBER OF CLOCK SIGNALS PASSED OUT OF 8 | DESIRED OUTPUT SAMPLE RATE (kHz) |
|---|---|---|
| +4 | 8 | 64 |
| +3 | 7 | 56 |
| +2 | 6 | 48 |
| +1 | 5 | 40 |
| 0 | 4 | 32 |
| −1 | 3 | 24 |
| −2 | 2 | 16 |
| −3 | 1 | 8 |
| −4 | 0 | DC |

The following examples should illustrate the operation of the sigma-delta system. Assume, for purposes of illustration, that the sigma-delta modulator 68 is clocked at 3.072 MHz. Assume also that the master clock signal is 24.576 MHz. If the desired sample rate of 48 kHz is entered by a user on line 52, then a corresponding frequency select number will be produced by frequency select circuit 54 and modulated by the fourth order, four-bit sigma-delta modulator 68. The four-bit code generated by modulator 68 will be, on average, a +2 code, although other four-bit codes will be produced but with a lower frequency of occurrence. The time-base (i.e., the temporal spacing between samples) is sigma-delta modulated so that errors due to temporal displacement between sampled data points that cause noise are shaped into a high frequency range. This noise is then removed by conventional filtering techniques with filters 76 and 84.

As shown in Table 1, the +2 code (on average) directs randomizer/suppressor circuit 64 to allow 6/8, or 3/4, of the master clock signal (at 24.576 MHz) to pass. In other words, the frequency of the master clock signal is reduced by 25% in this example. The clock signal output by randomizer/suppressor circuit 64 on line 66 is 18.432 MHz. The 18.432 MHz signal has a sigma-delta noise-shaped characteristic. The 18.432 MHz signal is approximately equal to 384 times the desired output sample rate of 48 kHz. Divider 70 reduces the frequency of the 18.432 MHz signal on line 66 by a factor of 6 to a 3.072 MHz signal on line 44. Thus, the sigma-delta ADC 72 is clocked at a rate of 3.072 MHz. The rate (3.072 MHz) of the sigma-delta ADC 72 is 64 times the desired output sample rate of the 48 kHz. Thus, the oversampling ratio, in this example, is 64. Decimator 80 (which decimates by 16) and decimator 88 (which decimates by 4) are effective in combination to decimate by 64 to produce output samples on bus 90 at the desired output sample rate of 48 kHz.

As another example, assume that the desired output sample rate is 4 kHz. To produce the output samples on bus 90 at a rate of 4 kHz, the sigma-delta ADC would have to be clocked at 64 times 4 kHz, or 256 kHz. The 20-bit frequency select number produced by frequency select circuit 54, in response to an input of 4 kHz on line 52, is such that the sigma-delta modulator 68 produces, on average, an equal number of −3 and −4 four-bit codes, although other four-bit codes will be produced, but with a lower frequency of occurrence.

As shown in Table 1, the −3 code directs the randomizer/suppressor circuit 64 to maintain exactly the frequency of the master clock signal. In contrast, the −4 code directs the randomizer/suppressor circuit to reduce the frequency of the master clock signal to 0. As illustrated, the −3 code represents an output sample rate of 8 kHz and the −4 code represents an output sample rate of DC (0 Hz). Therefore, on average of many samples, the −3 and −4 four-bit codes represent an output sample rate of 4 kHz. After conversion of an analog input signal by sigma-delta ADC 72 at a rate of 256 kHz, and decimation by 64 of the produced data samples by decimators 80 and 88, the output sample rate of the digital samples on bus 90, on average of many samples, will be equal to 4 kHz.

As another example, to obtain an output sampling rate of between 56 kHz and 64 kHz, that output sampling rate would be entered and a frequency select number would be chosen such that the appropriate ratio of +3 and +4 four-bit codes would be outputted by sigma-delta modulator 68. Thus, as one skilled in the art will appreciate, any output sample rate within the working range of the system (o to 64 kHz in this illustrative example) can be produced by selecting a frequency select number that causes the modulator to output the appropriate combination of four-bit codes.

Although a four-bit sigma-delta modulator has been described, the invention is not so limited. For example, a sigma-delta modulator that outputs fewer bits can be used if the modulator is clocked at a faster rate to achieve approximately the same signal-to-noise ratio. Similarly, a sigma-delta modulator that outputs a greater number of bits can be used, and the modulator can then be clocked at a lower rate. One skilled in the art will appreciate that the number of bits outputted and the clock rate at which the modulator operates are a function of the desired resolution and signal-to-noise ratio and can be selected and balanced depending upon the requirements of a particular application.

In the circuit of FIG. 3, both the magnitude and the temporal spacing of the digital samples are sigma-delta encoded by ADC 30 and modulator 68, respectively. The sampling times may have jitter or time variation associated therewith due to the fact that the randomizer/suppressor circuit 64 (under control of sigma-delta modulator 68) and divider 70 produce a clock signal that may not correspond exactly to the oversampling ratio times the specified output sample rate (0 kHz to 64 kHz in the illustrated embodiment). One of the advantages of sigma-delta modulation of the time base is that the jitter or time variation of the sampling times has a sigma-delta noise-shaped characteristic, so that any errors that result from jitter noise are reduced by filtering in the digital domain.

Figure 4:
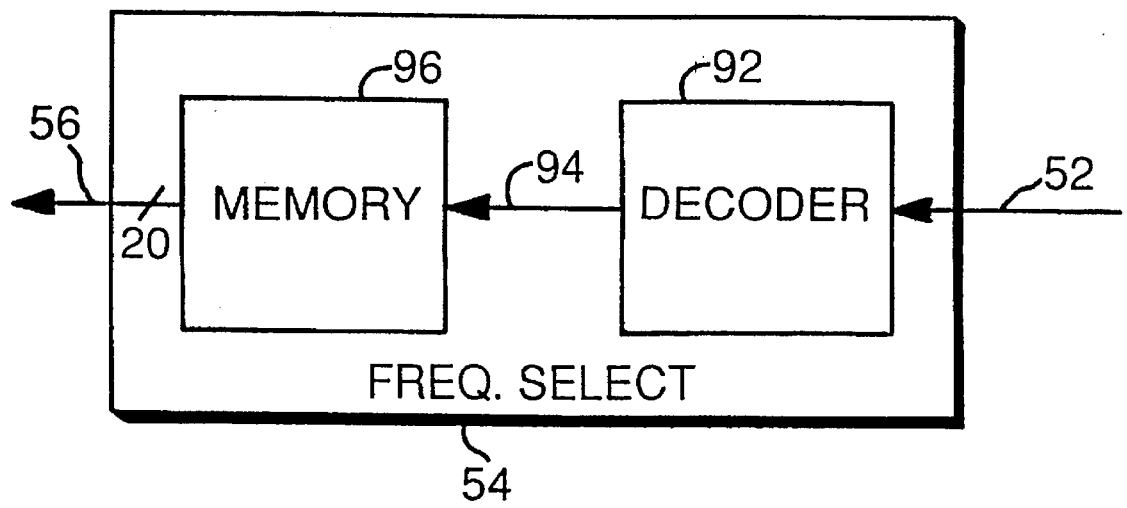
FIG. 4 is a block diagram of one embodiment of the frequency select circuit of FIG. 3.

FIG. 4 is a block diagram of one embodiment of the frequency select circuit 54. Frequency select circuit 54 receives the desired output sample rate on line 52 and produces the appropriate 20-bit frequency select number on line 56. Frequency select circuit 54 includes a memory element 96 (which may be a RAM or ROM, for example) for storing a look-up table containing the 20-bit frequency select numbers and the output sample rates to which the frequency select numbers correspond. Frequency select circuit 54 also includes a decoder 92 which, in response to the desired output sample rate inputted by a user on line 52, communicates along line 94 to select the 20-bit frequency select number from memory 96 most closely corresponding to the desired output sample rate. The 20-bit frequency select number is then outputted on 20-bit bus 56 to the sigma-delta modulator.

Alternatively, and preferably, frequency select circuit 54 produces the frequency select number by multiplying the desired output sample rate number (as inputted by a user) by a constant scaling factor.

Figure 5:
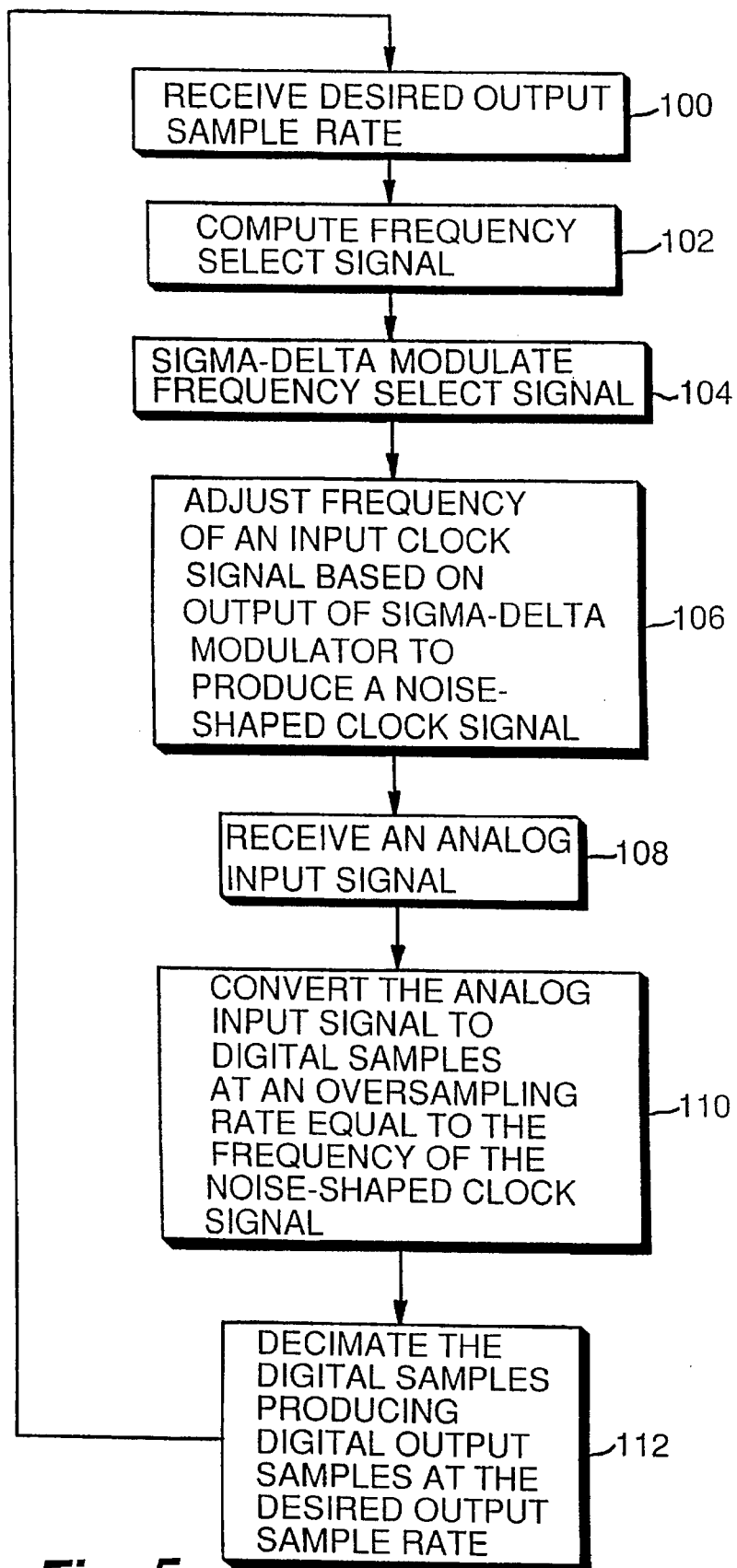
FIG. 5 is a flow chart broadly listing the steps of a method according to the present invention.

FIG. 5 is a flow chart illustrating the steps of the method of analog-to-digital conversion of the present invention. As shown in FIG. 5, the method of the present invention begins by receiving, as an input, a desired output sample rate in step 100. The method then proceeds to step 102 in which a frequency select signal is generated corresponding to the desired output sample rate. In step 104, the frequency select signal is sigma-delta modulated. Based on the output code of the sigma-delta modulator, in step 106, the frequency of an input clock signal is adjusted to produce a noise-shaped clock signal. The input clock signal can include a master clock signal. In step 108, an analog input signal is received. In step 110, the analog input signal is converted to digital samples at an oversampling rate equal to the frequency of the noise-shaped clock signal. Then, in step 112, the digital samples are decimated by a decimation factor equal to the oversampling ratio to produce digital output samples at the desired output sample rate. The steps 100–112 of this method can then be repeated.

A significant advantage of the present invention is that the sigma-delta modulator used to control the randomizer/suppressor circuit can be clocked using a fixed clock frequency, allowing optimization of the modulator operation. In addition, by outputting an appropriate combination of sigma-delta control codes, a nearly infinite number of sample rates for the output samples can be provided. These output sample rates do not need to have any integer or other rational relationship to the master clock signal of the system. Therefore, a user can select any desired output sample rate within a working range of the system and have samples produced at that rate with a high degree of accuracy. The system requires only a single master clock and is implemented with relatively simple circuitry.

Having thus described one particular embodiment of the invention, various alterations, modifications and improvements will readily occur to those skilled in the art. For example, the present invention can be used in conjunction with any type of ADC or analog-to-digital conversion method and is not limited to sigma-delta ADCs. Such alterations, modifications and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. An ADC system comprising:
    an ADC, receiving an analog input signal and, responsive to a noise-shaped clock signal, converting the analog input signal to digital samples at an oversampling rate;
    a decimator, coupled to the ADC, receiving the digital samples and decimating the digital samples to produce the digital samples at a preselected output sample rate, less than or equal to the oversampling rate; and
    an ADC sample rate control circuit, coupled to the ADC, receiving a frequency select signal representing the output sample rate, and producing the noise-shaped clock signal for controlling operation of the ADC at the oversampling rate, the control circuit including a sigma-delta modulator for sigma-delta modulating the frequency select signal.

2. An ADC system as claimed in claim 1 wherein the ADC includes a sigma-delta ADC.

3. An ADC system as claimed in claim 1 wherein the control circuit includes a frequency select circuit, coupled to the sigma-delta modulator, receiving the preselected output sample rate as an input signal, and producing the frequency select signal for provision to the sigma-delta modulator.

4. An ADC system as claimed in claim 3 wherein the frequency select circuit also includes a memory element storing a plurality of frequency select signals and corresponding output sample rates, and a decoder, coupled to the memory element, receiving the preselected output sample rate and selecting a corresponding frequency select signal for provision to the sigma-delta modulator.

5. An ADC system as claimed in claim 1 wherein the control circuit also includes a randomizer/suppressor circuit, coupled between the sigma-delta modulator and the ADC, receiving an input clock signal and adjusting the frequency of the input clock signal based on the output of the sigma-delta modulator to produce a noise-shaped clock signal for controlling the oversampling rate of the ADC.

6. An ADC system as claimed in claim 5 wherein the control circuit further includes a frequency divider, coupled between the randomizer/suppressor circuit and the ADC, for adjusting the frequency of the noise-shaped clock signal.

7. An ADC system as claimed in claim 5 wherein the input clock signal includes a master clock signal.

8. An ADC system comprising:
    means, responsive to a noise-shaped clock signal, for converting an analog input signal to digital samples at an oversampling rate;
    means, coupled to the means for converting, for decimating the digital samples to produce the digital samples at a preselected output sample rate, less than or equal to the oversampling rate; and
    control circuit means, coupled to the means for converting, receiving a frequency select signal representing the output sample rate, for producing the noise-shaped clock signal for controlling operation of the means for converting at the oversampling rate, the control circuit means including a sigma-delta modulator for sigma-delta modulating the frequency select signal.

* * * * *